(12) United States Patent
Strong et al.

(10) Patent No.: US 9,966,885 B1
(45) Date of Patent: May 8, 2018

(54) METHODS AND SYSTEMS FOR CALIBRATION OF A MOTOR (71) Applicant: HONEYWELL INTERNATIONAL INC., Morris Plains, NJ (US)

(72) Inventors: Ron Strong, Phoenix, AZ (US); Thom Kreider, Peoria, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days. days.

(21) Appl. No.: 15/622,837

(22) Filed: Jun. 14, 2017

Related U.S. Application Data (60) Provisional application No. 62/442,814, filed on Jan. 5, 2017.

(51) Int. Cl.
*H02P 6/17* (2016.01)

(52) U.S. Cl.
CPC ..................... *H02P 6/17* (2016.02)

(58) Field of Classification Search
CPC ...... H02P 6/04; H02P 6/08; H02P 6/10; H02P 6/16; H02P 6/17
USPC .................................................. 318/400.38
See application file for complete search history.

(56) References Cited

U.S. PATENT DOCUMENTS

| | | | | |
|---|---|---|---|---|
| 5,296,787 A * | 3/1994 | Albrecht | ................... | H02P 6/06 318/400.4 |
| 7,436,139 B2 * | 10/2008 | Maslov | ..................... | H02P 6/15 318/400.01 |
| 7,885,785 B1 * | 2/2011 | Pekarek | .................... | H02P 6/10 318/400.01 |
| 8,018,193 B1 | 9/2011 | Pekarek et al. | | |
| 8,030,865 B2 * | 10/2011 | Yasuda | ..................... | H02P 6/16 318/400.07 |
| 9,059,649 B1 * | 6/2015 | Droz | ......................... | H02P 6/16 |
| 9,175,984 B2 * | 11/2015 | Si | ........................... | G01D 5/245 |
| 9,182,214 B2 * | 11/2015 | Kaufmann | .............. | H02P 6/185 |
| 9,634,591 B2 * | 4/2017 | Qian | ......................... | H02P 6/16 |

(Continued)

FOREIGN PATENT DOCUMENTS

CN          101902112 A          12/2010

OTHER PUBLICATIONS

Beccue, Philip B. et al., "Compensation for Asymmetries and Misalignment in a Hall-Effect Position Observer Used in PMSM Torque-Ripple Control," IEEE Transactions of Industry Applications, vol. 43, No. 2, Mar./Apr. 2007, p. 560-570.

*Primary Examiner* — Rita Leykin
(74) *Attorney, Agent, or Firm* — Lorenz & Kopf, LLP (57) ABSTRACT

A method for calibrating a motor, the motor comprising a permanent magnet synchronous motor, is provided. The method generates a rotating magnetic field using a voltage vector, the rotating magnetic field configured to rotate at a constant angular velocity independent of an actual rotor position, and the rotating magnetic field rotating in a first direction; identifies, by a processor, timing data associated with a plurality of digital Hall effect sensors; computes, by the processor, accurate positions for each of the plurality of digital Hall effect sensors, using the timing data and the constant angular velocity; creates a reference table in system memory, by the processor, the reference table comprising the accurate positions; and during operation of the motor, calculates accurate angular velocity values for the motor, using the reference table.

20 Claims, 5 Drawing Sheets

(56) References Cited

U.S. PATENT DOCUMENTS

| | | | | |
|---|---|---|---|---|
| 2004/0061470 A1* | 4/2004 | Ito | ............................ | H02K 29/08 |
| | | | | 318/565 |
| 2005/0248306 A1* | 11/2005 | Chen | ........................ | H02P 6/16 |
| | | | | 318/712 |
| 2014/0225546 A1* | 8/2014 | Sato | .......................... | H02P 6/10 |
| | | | | 318/400.26 |

* cited by examiner

METHODS AND SYSTEMS FOR CALIBRATION OF A MOTOR

CROSS-REFERENCE TO RELATED APPLICATION(S)

This application claims the benefit of U.S. provisional patent application Ser. No. 62/442,814, filed Jan. 5, 2017.

TECHNICAL FIELD

Embodiments of the subject matter described herein relate generally to calibrating a motor, and more particularly, to using digital Hall effect sensor positions to calibrate a motor.

BACKGROUND

Angular position sensors used for commutation and position control in motor drives have errors associated with mechanical sensor placement during construction. Systems requiring high position accuracy typically use calibration data to adjust the feedback values in the controller during operation. Calibration data is generally collected during system manufacturing tests or during field commissioning, and is specific to a certain part or installation. This causes the calibration data to be specific to a particular motor, and increases the cost to deploy a motor.

Accordingly, it is desirable to provide additional methods and systems for calibration of a motor. Furthermore, other desirable features and characteristics will become apparent from the subsequent detailed description and the appended claims, taken in conjunction with the accompanying drawings and the foregoing technical field and background.

BRIEF SUMMARY

Some embodiments of the present disclosure provide a method for calibrating a motor, the motor comprising a permanent magnet synchronous motor. The method generates a rotating magnetic field using a voltage vector, the rotating magnetic field configured to rotate at a constant angular velocity independent of an actual rotor position, and the rotating magnetic field rotating in a first direction; identifies, by a processor, timing data associated with a plurality of digital Hall effect sensors; computes, by the processor, accurate positions for each of the plurality of digital Hall effect sensors, using the timing data and the constant angular velocity; creates a reference table in system memory, by the processor, the reference table comprising the accurate positions; and during operation of the motor, calculates accurate angular velocity values for the motor, using the reference table.

Some embodiments of the present disclosure provide a system for calibrating a motor, the motor comprising a permanent magnet synchronous motor. The system includes a system memory element; a plurality of digital Hall effect sensors, configured to detect polarity changes of rotor magnets relative to the plurality of digital Hall effect sensors during rotation of the motor; and at least one processor, communicatively coupled to the system memory element and the plurality of Hall effect sensors, the at least one processor configured to: generate a rotating magnetic field using a voltage vector, the rotating magnetic field configured to rotate at a constant angular velocity independent of an actual rotor position, and the rotating magnetic field rotating in a first direction; identify timing data associated with the detected polarity changes of the plurality of digital Hall effect sensors; compute accurate positions for each of the plurality of digital Hall effect sensors, using the timing data and the constant angular velocity; create a reference table in system memory the reference table comprising the accurate positions; and during operation of the motor, calculate accurate angular velocity values for the motor, using the reference table.

Some embodiments of the present disclosure provide a non-transitory, computer-readable medium containing instructions thereon, which, when executed by a processor, perform a method. The method initiates a calibration mode of a motor, the motor comprising a permanent magnet synchronous motor; generates a rotating magnetic field using a voltage vector, the rotating magnetic field configured to rotate at a constant angular velocity independent of an actual rotor position, and the rotating magnetic field rotating in a first direction; detects polarity changes of rotor magnets relative to the plurality of digital Hall effect sensors during rotation of the motor; identifies, by a processor, timing data associated with the polarity changes of the plurality of digital Hall effect sensors; computes, by the processor, accurate positions for each of the plurality of digital Hall effect sensors, using the timing data and the constant angular velocity wherein the accurate positions comprise calculated distances between the digital Hall effect sensors; creates a reference table in system memory, by the processor, the reference table comprising the accurate positions; exits the calibration mode of the motor; and during operation of the motor, calculates accurate angular velocity values for the motor, using the reference table, wherein the accurate angular velocity values are calculated using the calculated distances stored in the reference table.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The subject matter presented herein relates to apparatus and methods for calibrating a permanent magnet synchronous motor using digital Hall Effect sensors. In embodiments of the present disclosure, digital Hall Effect sensors are used for commutation of six-step, brushless, direct current (DC) motors. Here, Hall Effect sensor transition events (i.e., "Hall events") are also used for speed determination. Hall Effect sensors detect polarity changes of rotor magnets relative to the Hall Effect sensors for each motor phase as the motor rotates. Speed is determined by measuring the time between Hall events. However, Hall events are not periodic. The speed feedback update rate is dependent on the speed of the motor, but the feedback is often used by a periodic digital controller. At low motor speeds, the update rate of the derived speed measurement eventually becomes lower than the controller's sample rate. At high speeds, there are abundant updates relative to the sample rate, but sensor noise becomes an issue due to manufacturing variances in the motor magnet placement.

Contemplated herein are systems and methods to determine motor speed feedback over a large operational range useful for digital speed control, using a multi-mode speed calculation that provides feedback signals appropriate for each speed range. Exemplary embodiments of the present disclosure provide a large number of updates per motor revolution at low speeds while providing less noise in the speed estimate at high speeds. The present disclosure provides a method to calibrate digital Hall Effect position sensors used in operational Field Oriented Control (FOC) or sinusoidal drives, and allows the drive Hall Effect sensor positions to be calibrated on-demand, during operation.

Certain terminologies are used with regard to the various embodiments of the present disclosure. A six-step, brushless, direct current (DC) motor is a Permanent Magnet Synchronous Motor (PMSM) or a Permanent Magnet AC (PMAC) motor, for example, and functions to rotate at a constant angular velocity. A digital Hall Effect sensor is a transducer that varies its output voltage in response to a magnetic field. A polarity change, detected by a digital Hall Effect sensor, occurs when the detected polarity of the plurality of rotor magnets of the motor alternates. The rotor magnets are positioned according to alternating polarity, and the detected pole alternates as multiple rotor magnets with alternating polarity pass in front of the Hall Effect sensor.

Figure 1:
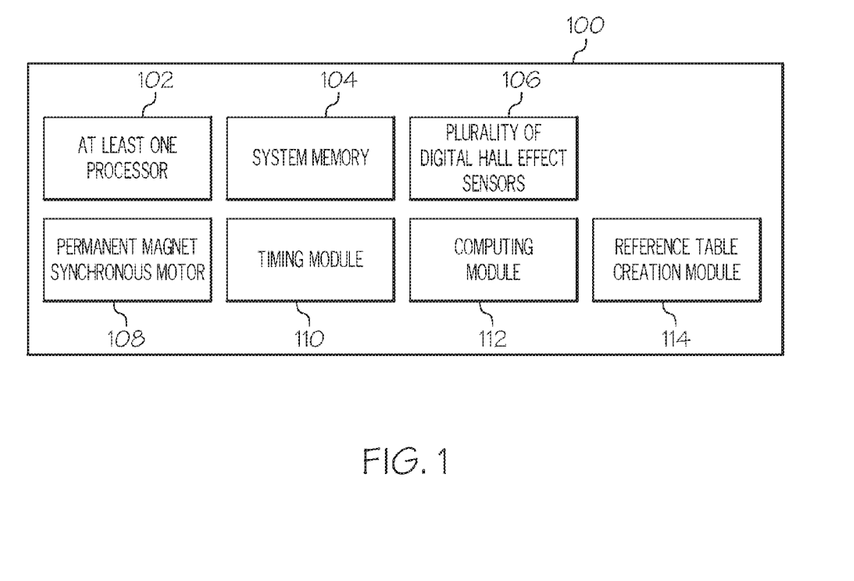
FIG. 1 is a functional block diagram of a motor calibration system, in accordance with the disclosed embodiments.

Turning now to the figures, FIG. 1 is a functional block diagram of a motor calibration system 100, in accordance with the disclosed embodiments. The motor calibration system 100 is generally used create a reference table of accurate positions for the digital Hall effect sensors, which may be used during future operation of the motor for more accurate calculations of angular velocity values for the motor.

The motor calibration system 100 generally includes, without limitation, at least one processor 102; some form of system memory 104; a plurality of digital Hall Effect sensors 106; a permanent magnet synchronous motor 108; a timing module 110; a computing module 112; and a reference table creation module 114. These elements and features of motor calibration system 100 may be operatively associated with one another, coupled to one another, or otherwise configured to cooperate with one another as needed to support the desired functionality—in particular, calibrating a permanent magnet synchronous motor, as described herein. For ease of illustration and clarity, the various physical, electrical, and logical couplings and interconnections for these elements and features are not depicted in FIG. 1. Moreover, it should be appreciated that embodiments of the motor calibration system 100 will include other elements, modules, and features that cooperate to support the desired functionality. For simplicity, FIG. 1 only depicts certain elements that relate to the motor calibration techniques described in more detail below.

The at least one processor 102 may be implemented or performed with one or more general purpose processors, a content addressable memory, a digital signal processor, an application specific integrated circuit, a field programmable gate array, any suitable programmable logic device, discrete gate or transistor logic, discrete hardware components, or any combination designed to perform the functions described here. In particular, the at least one processor 102 may be realized as one or more microprocessors, controllers, microcontrollers, or state machines. Moreover, the at least one processor 102 may be implemented as a combination of computing devices, e.g., a combination of digital signal processors and microprocessors, a plurality of microprocessors, one or more microprocessors in conjunction with a digital signal processor core, or any other such configuration.

The at least one processor 102 communicates with system memory 104. System memory 104 may be realized using any number of devices, components, or modules, as appropriate to the embodiment. Moreover, the motor calibration system 100 could include system memory 104 integrated therein and/or system memory 104 operatively coupled thereto, as appropriate to the particular embodiment. In practice, the system memory 104 could be realized as RAM memory, flash memory, EPROM memory, EEPROM memory, registers, a hard disk, a removable disk, or any other form of storage medium known in the art. In certain embodiments, the system memory 104 includes a hard disk, which may also be used to support functions of the motor calibration system 100. The system memory 104 can be coupled to the at least one processor 102 such that the at least one processor 102 can read information from, and write information to, the system memory 104. In the alternative, the system memory 104 may be integral to the at least one processor 102. As an example, the at least one processor 102 and the system memory 104 may reside in a suitably designed application-specific integrated circuit (ASIC).

Figure 2:
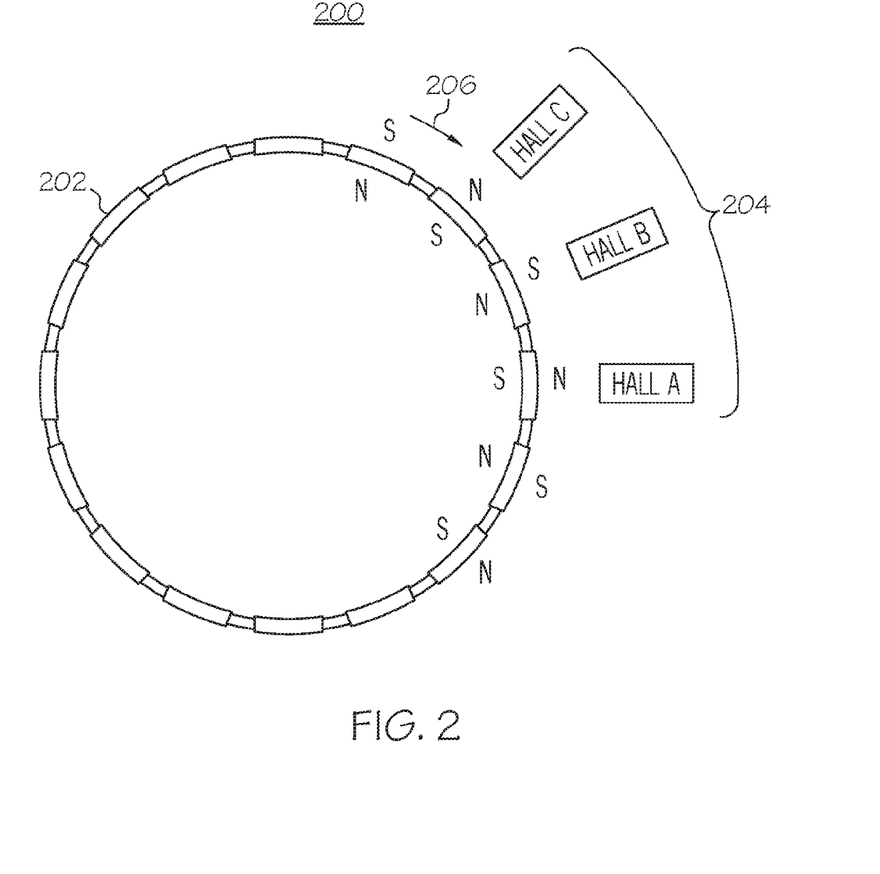
FIG. 2 is a diagram of a permanent magnet synchronous motor and digital Hall effect sensors, in accordance with the disclosed embodiments.

The plurality of digital Hall Effect sensors 106 are positioned within a defined proximity of the permanent magnet synchronous motor 108, and are configured to provide an output voltage (as shown in FIG. 2) associated with magnet polarity. The output voltage of the plurality of digital Hall Effect sensors 106 is "high" or "low" based on detected polarity changes of the permanent magnet synchronous motor 108. Each change of the output voltage from high to low, or low to high, may be referred to as a "Hall event". During rotation of the permanent magnet synchronous motor 108, timing of the Hall events may be obtained by the timing module 110 and used by the computing module 112 to calculate accurate positions of each of the plurality of digital Hall Effect sensors 106.

The permanent magnet synchronous motor 108 may be implemented using a Permanent Magnet Synchronous Motor (PMSM) or a Permanent Magnet AC (PMAC) motor, which is often controlled using a Field Oriented Control (FOC) scheme. The permanent magnet synchronous motor 108 is operable to rotate at a constant angular velocity such that the timing module 110, the computing module 112, and the reference table creation module 114 function to detect the timing of particular Hall events (the Hall events generated by the plurality of digital Hall Effect sensors 106), calculate positioning of the Hall Effect sensors 106 based on the timing, and create a reference table that stores the Hall Effect sensor 106 positions.

The timing module 110 is suitably configured to obtain timing data associated with polarity changes that occur during rotation of the permanent magnet synchronous motor 108. Such timing data may include a time-stamp or another timing value or event that occurs at a polarity change, time difference values, and/or average time distance values.

The computing module 112 is configured to calculate accurate positions of the digital Hall Effect sensors 106, using the timing data obtained by the timing module 110. Generally, positions of the digital Hall Effect sensors 106 are known values. However, these known values may be inaccurate, and calculations may be performed to determine an accurate position for each of the digital Hall effect sensors The reference table creation module 114 catalogs the accurate positions provided by the computing module 112, by storing these accurate, calculated positions in a reference table or other data structure in system memory 104.

In practice, the timing module 110, the computing module 112, and/or the reference table creation module 114 may be implemented with (or cooperate with) the at least one processor 102 to perform at least some of the functions and operations described in more detail herein. In this regard, the timing module 110, the computing module 112, and/or the reference table creation module 114 may be realized as suitably written processing logic, application program code, or the like.

FIG. 2 is a diagram of a structure 200 that includes a permanent magnet synchronous motor 202 and a plurality of digital Hall Effect sensors 204, in accordance with the disclosed embodiments. It should be appreciated that FIG. 2 depicts a simplified embodiment of the structure 200, and that some implementations of the structure 200 may include additional elements or components, as desired for the particular application. For example, additional components such as computing devices, displays, and/or user input components may be employed without departing from the scope of the present disclosure.

As shown, the permanent magnet synchronous motor 202 includes a plurality of magnets positioned around the circumference of the motor 202, and the magnets are positioned such that each magnet presents an opposite polarity of the magnet immediately to the left and right of the first magnet. Thus, the magnets alternate in polarity around the circumference of the motor 202. Polarity change 206 illustrates the transition, at Hall Effect sensor "Hall C", from a detected "south" polarity to a "north" polarity, when the motor 202 rotates in a clockwise direction. The plurality of digital Hall Effect sensors 204 are positioned outside of the permanent magnet synchronous motor 202.

During operation, the permanent magnet synchronous motor 202 rotates, and each of the magnets, with alternating polarity, pass within proximity of the Hall Effect sensors 204 during this rotation. The technique is to generate a rotating magnetic field using a fixed magnitude stator current, rotating at a constant speed independent of actual rotor position. Digital Hall effect transition event time-stamps are collected while the rotor is forced to rotate in both positive and negative motor directions. The collected event time-stamps and the known constant angular rate are used to determine accurate positions for all Hall sensors using simple mathematical operations. These accurate Hall sensor positions are treated as calibration data to be stored in operational memory. The calibration data is used to determine fine offsets to each operational Hall Effect sensor edge event to improve position sensing accuracy during motor operation.

Figure 3:
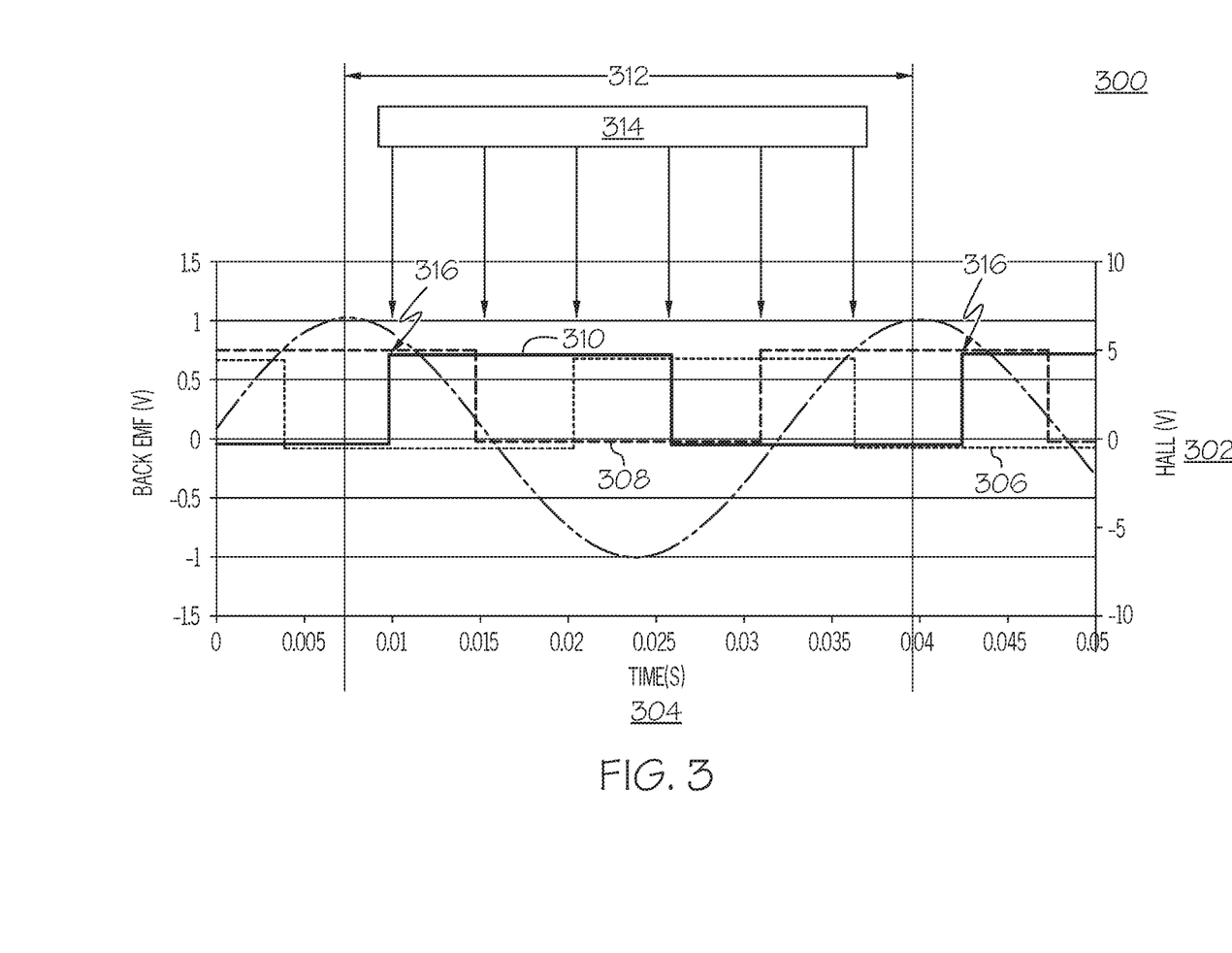
FIG. 3 is a plot illustrating events occurring during one electrical revolution of the permanent magnet synchronous motor.

FIG. 3 is a plot 300 illustrating events occurring during one electrical revolution 312 of the permanent magnet synchronous motor. The plot 300 shows the output voltage 302 of three Hall Effect sensors versus time 304, in the form of output voltage signals 306, 308, 310. As shown, for output voltage signal 310, there is one rising edge per electrical revolution (see reference 316). There are six (6) Hall state changes 314 per electrical revolution 312. Each of the Hall state changes 314 is a rising or falling edge of the output voltage signals 306, 308, 310, indicating that a Hall state change (i.e., a hall Event 314) is an abrupt shift from a 5 volt (V) output signal to a 0V output signal, or from a 0V output signal to a 5V output signal.

In certain embodiments, timing data associated with each Hall Effect sensor includes a time-stamp for each Hall event 314. In other words, a time-stamp is obtained at each rising edge and each falling edge of the output voltage signal 306, 308, 310 for each digital Hall Effect sensor. Time-stamps associated with each of the Hall events 314 are used to determine average time difference values, which are then used to calculate accurate positions for the digital Hall Effect sensors.

Figure 4:
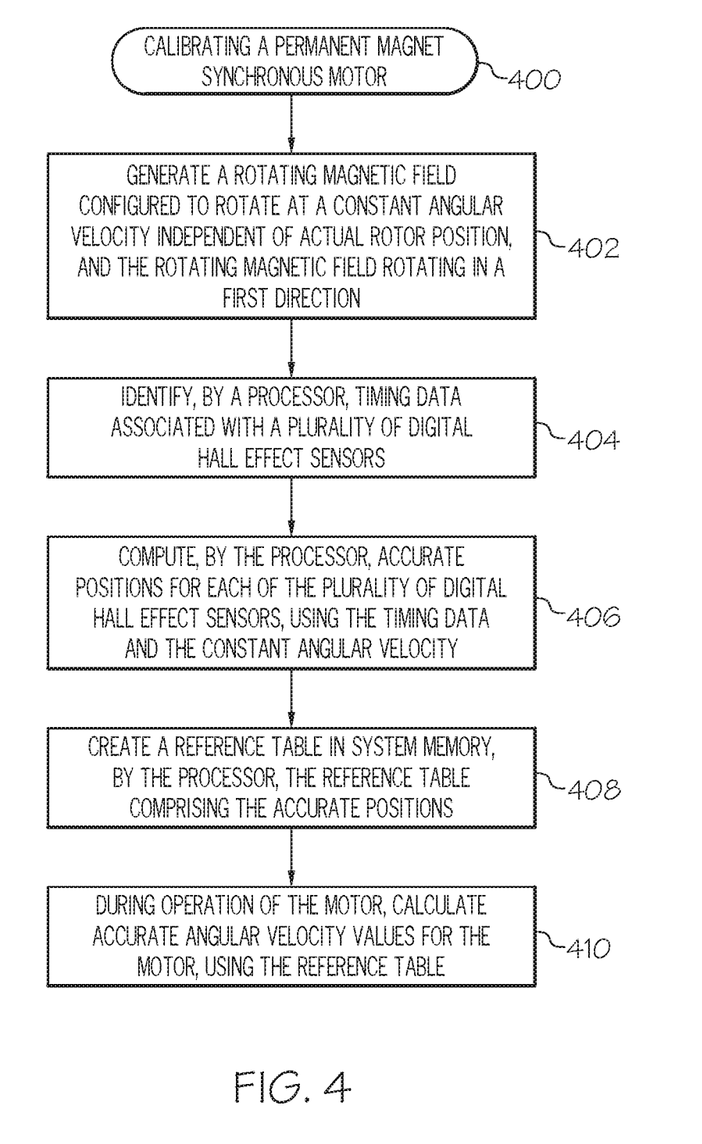
FIG. 4 is a flow chart that illustrates an embodiment of a process for calibrating a permanent magnet synchronous motor.

FIG. 4 is a flow chart that illustrates an embodiment of a process 400 for calibrating a permanent magnet synchronous motor. For ease of description and clarity it is assumed that the process 400 begins by generating a rotating magnetic field configured to rotate at a constant angular velocity independent of actual rotor position feedback, and the rotating magnetic field rotating in a first direction (402). Embodiments of the process 400 may generate the rotating magnetic field using a voltage vector or a current vector.

Next, the process 400 identifies, by a processor, timing data associated with a plurality of digital Hall Effect sensors (step 404) Timing data may include any indication of a time-value, such as a time-stamp acquired from a motor controller executing the process 400, wherein the motor controller is in communication with the digital Hall Effect sensors. Here, the process 400 obtains timing data associated with one or more defined "Hall Events". In some embodiments, the process 400 performs adjustments to, or calculations using, the time-stamps in order to determine timing data suitable for use in the calculations of step 406. One exemplary embodiment for identifying timing data associated with a plurality of digital Hall Effect sensors is described below with respect to FIG. 5, including additional detail.

The process 400 then computes, by the processor, accurate positions for each of the plurality of digital Hall Effect sensors, using the timing data and the constant angular velocity (step 406). Each digital Hall Effect sensor has a position ($\theta$), and each distance value between two Hall Effect sensors is defined as $\Delta\theta$. The motor is rotating at a constant angular velocity ($\omega$), as described in step 402, and the constant angular velocity ($\omega$) may also be referred to as the motor speed. The speed ($\omega$) and time values (based on timing information obtained in step 404) are known to the process 400.

The following equation may be used by the process 400 to calculate accurate distance values ($\Delta\theta$) between each of the Hall Effect sensors: $\omega=(\Delta\theta)/\Delta t$, where $\Delta t$ is the timing data associated with Hall Events. For a particular Hall Effect sensor, timing data associated with Hall Events may be collected, and using the timing data and speed (ω), the process 400 calculates the position (θ) of the particular Hall Effect sensor. Once positions (θ) for each of the Hall Effect sensors are calculated, the process 400 calculates accurate distance values (Δθ) between each of the Hall Effect sensors.

Next, the process 400 creates a reference table in system memory, by the processor, the reference table comprising the accurate positions (step 408) for each of the digital Hall Effect sensors. The accurate positions include the calculated distance values (Δθ) between each of the digital Hall Effect sensors, and are used in calibration of the motor.

Then, during operation of the motor, the process 400 calculates accurate angular velocity values for the motor, using the reference table (step 410). Here, the accurate positions of the digital Hall Effect sensors are the calculated distances (Δθ) between the digital Hall Effect sensors, and the accurate angular velocity values are calculated using the calculated distances (Δθ) stored in the reference table. The accurate Hall Effect sensor positions are stored in operational memory and treated as calibration data for the motor. The calibration data is used to determine positioning for each operational Hall Effect sensor edge event to improve position sensing accuracy during motor operation.

The process 400 operates as a part of a motor driver which uses a digital processing element (e.g., a central processing unit (CPU), microcontroller unit (MCU), digital signal processor (DSP), field programmable gate array (FPGA), application specific integrated circuit (ASIC), or the like). The process 400 is implemented as part of the control system as a mode of operation using software or digital logic techniques that are known in the art.

Process 400 functions to calibrate a motor and, in certain embodiments, prior to generating the rotating magnetic field, the process 400 initiates a calibration mode of the motor. After creating the reference table (step 408), the process 400 exits the calibration mode of the motor. Here, the operation of the motor occurs after calibration is performed, wherein the calibration is completed during the calibration mode.

Figure 5:
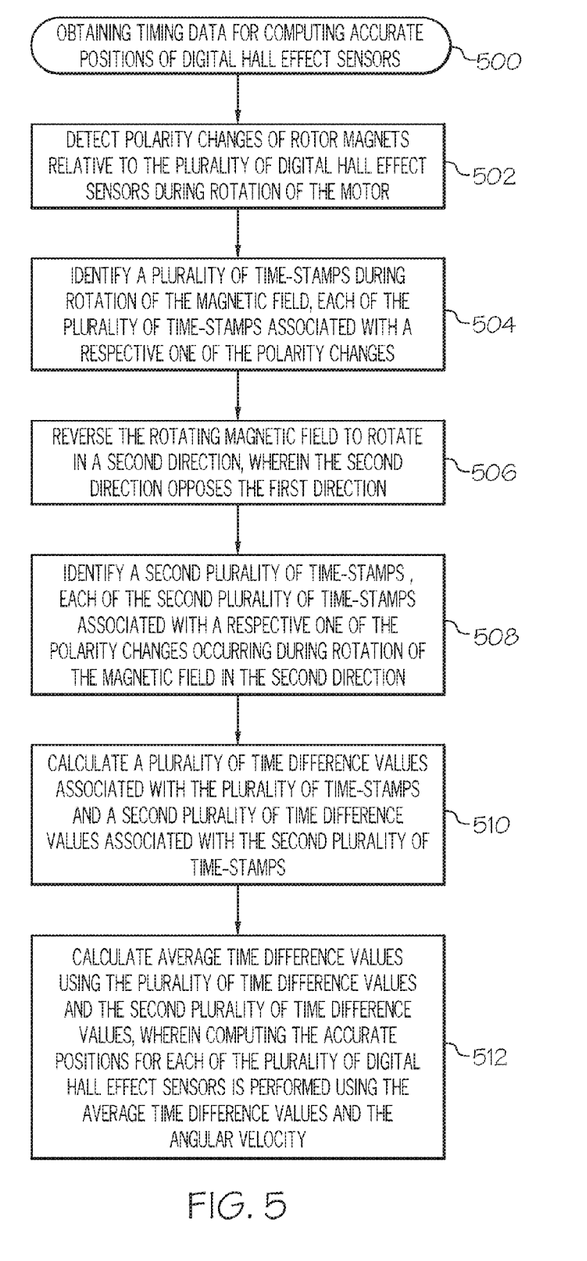
FIG. 5 is a flow chart that illustrates an embodiment of a process for obtaining timing data for use in computing accurate positions of digital Hall effect sensors.

FIG. 5 is a flow chart that illustrates an embodiment of a process 500 for obtaining timing data for use in computing accurate positions of digital Hall Effect sensors. Process 500 is one exemplary embodiment of step 404 of FIG. 4, described previously, including additional detail. First, the process 500 detects polarity changes of rotor magnets relative to the plurality of digital Hall effect sensors during rotation of the motor (step 502).

Next, the process 500 identifies a plurality of time-stamps during rotation of the magnetic field, each of the plurality of time-stamps associated with a respective one of the polarity changes (step 504). In certain embodiments, the process 500 is executed by a processor or controller, and the time-stamps are obtained from the clock of the processor or controller at the point in time that each Hall Event (e.g., change in polarity detected by the Hall Effect sensors) takes place.

The process 500 then reverses the rotating magnetic field to rotate in a second direction, wherein the second direction opposes the first direction (step 506). Next, the process 500 identifies a second plurality of time-stamps, each of the second plurality of time-stamps associated with a respective one of the polarity changes occurring during rotation of the magnetic field in the second direction (step 508). Here, the process 500 reverses the rotating magnetic field and collects the second group of time-stamps to account for error in the calculations of the average time difference values of step 512.

After identifying the first plurality of time-stamps (step 504) and the second plurality of time-stamps (step 508), the process 500 calculates (1) a plurality of time difference values associated with the plurality of time-stamps, and (2) a second plurality of time difference values associated with the second plurality of time-stamps (step 510). The time difference values are the change in time from a first time-stamp to a second time-stamp.

Once the process 500 has calculated the plurality of time difference values and the second plurality of time difference values (step 510), then the process 500 calculates average time difference values using the plurality of time difference values and the second plurality of time difference values, wherein computing the accurate positions for each of the plurality of digital Hall effect sensors (see step 406, FIG. 4) is performed using the average time difference values and the angular velocity (step 512).

Here, the process 500 averages each of the time differences between Hall events associated with the same Hall Effect sensors. For example, Hall Effect sensor A and Hall Effect sensor B may be positioned outside of a permanent magnet synchronous motor. As the rotating magnetic field rotates in a first direction, a first polarity change occurs between Hall Effect sensor A and Hall Effect sensor B. The process 500 identifies time-stamps associated with the magnets producing the first polarity change, and determines a first time difference value between Hall Effect sensor A and Hall Effect sensor B. The process 500 then reverses the rotating magnetic field, to rotate in a second direction, and a second polarity change occurs between Hall Effect sensor B and Hall Effect sensor A. The process 500 identifies a second set of time-stamps associated with the magnets producing the second polarity change, and determines a second time difference value between Hall Effect sensor B and Hall Effect sensor A. The process 500 then averages the first time difference value (between Hall Effect sensor A and Hall Effect sensor B during rotation in the first direction) and the second time difference value (between Hall Effect sensor B and Hall Effect sensor A during rotation in the second direction), to determine an average time difference value between Hall Effect sensor A and Hall Effect sensor B. Accurate positions for Hall Effect sensor A and Hall Effect sensor B are then computed using the average time difference value.

The various tasks performed in connection with processes 400-500 may be performed by software, hardware, firmware, or any combination thereof. For illustrative purposes, the preceding descriptions of processes 400-500 may refer to elements mentioned above in connection with FIGS. 1-3. In practice, portions of processes 400-500 may be performed by different elements of the described system. It should be appreciated that processes 400-500 may include any number of additional or alternative tasks, the tasks shown in FIGS. 4-5 need not be performed in the illustrated order, and processes 400-500 may be incorporated into a more comprehensive procedure or process having additional functionality not described in detail herein. Moreover, one or more of the tasks shown in FIGS. 4-5 could be omitted from embodiments of the processes 400-500 as long as the intended overall functionality remains intact.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "computer-readable medium", "processor-readable medium", or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. Thus, although the schematic shown in FIG. X depicts one exemplary arrangement of elements, additional intervening elements, devices, features, or components may be present in an embodiment of the depicted subject matter.

For the sake of brevity, conventional techniques related to signal processing, data transmission, signaling, network control, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Some of the functional units described in this specification have been referred to as "modules" in order to more particularly emphasize their implementation independence. For example, functionality referred to herein as a module may be implemented wholly, or partially, as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like. Modules may also be implemented in software for execution by various types of processors. An identified module of executable code may, for instance, comprise one or more physical or logical modules of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module. Indeed, a module of executable code may be a single instruction, or many instructions, and may even be distributed over several different code segments, among different programs, and across several memory devices. Similarly, operational data may be embodied in any suitable form and organized within any suitable type of data structure. The operational data may be collected as a single data set, or may be distributed over different locations including over different storage devices, and may exist, at least partially, merely as electronic signals on a system or network.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for calibrating a motor, the motor comprising a permanent magnet synchronous motor, the method comprising:
    generating a rotating magnetic field using a voltage vector, the rotating magnetic field configured to rotate at a constant angular velocity independent of an actual rotor position, and the rotating magnetic field rotating in a first direction;
    identifying, by a processor, timing data associated with a plurality of digital Hall effect sensors;
    computing, by the processor, accurate positions for each of the plurality of digital Hall effect sensors, using the timing data and the constant angular velocity;
    creating a reference table in system memory, by the processor, the reference table comprising the accurate positions; and
    during operation of the motor, calculating accurate angular velocity values for the motor, using the reference table.

2. The method of claim 1, further comprising:
    detecting polarity changes of rotor magnets relative to the plurality of digital Hall effect sensors during rotation of the motor;
    wherein the timing data is associated with the polarity changes.

3. The method of claim 1, wherein identifying the timing data further comprises:
identifying a plurality of time-stamps, each of the plurality of time-stamps associated with a respective one of the polarity changes, during rotation of the magnetic field; and
calculating a plurality of time difference values associated with the plurality of time-stamps, wherein the timing data comprises at least the plurality of time difference values.

4. The method of claim 3, further comprising:
calculating average time difference values using the plurality of time difference values;
wherein computing the accurate positions for each of the plurality of digital Hall effect sensors is performed using the average time difference values and the constant angular velocity.

5. The method of claim 3, further comprising:
reversing the rotating magnetic field to rotate in a second direction, wherein the second direction opposes the first direction;
identifying a second plurality of time-stamps, each of the second plurality of time-stamps associated with a respective one of the polarity changes, during rotation of the magnetic field in the second direction; and
calculating a second plurality of time difference values associated with the second plurality of time-stamps, wherein the timing data comprises at least the plurality of time difference values and the second plurality of time difference values.

6. The method of claim 5, further comprising:
calculating the average time difference values using the plurality of time difference values and the second plurality of time difference values;
wherein computing the accurate positions for each of the plurality of digital Hall effect sensors is performed using the average time difference values and the constant angular velocity.

7. The method of claim 1, further comprising:
initiating a calibration mode of the motor, by the processor, prior to generating the rotating magnetic field; and
after creating the reference table, exiting the calibration mode of the motor;
wherein the operation of the motor occurs after calibration is performed during the calibration mode.

8. The method of claim 1, wherein the accurate positions comprise calculated distances between the digital Hall effect sensors; and
wherein the accurate angular velocity values are calculated using the calculated distances stored in the reference table.

9. A system for calibrating a motor, the motor comprising a permanent magnet synchronous motor, the system comprising:
a system memory element;
a plurality of digital Hall effect sensors, configured to detect polarity changes of rotor magnets relative to the plurality of digital Hall effect sensors during rotation of the motor; and
at least one processor, communicatively coupled to the system memory element and the plurality of Hall effect sensors, the at least one processor configured to:
generate a rotating magnetic field using a voltage vector, the rotating magnetic field configured to rotate at a constant angular velocity independent of an actual rotor position, and the rotating magnetic field rotating in a first direction;
identify timing data associated with the detected polarity changes of the plurality of digital Hall effect sensors;
compute accurate positions for each of the plurality of digital Hall effect sensors, using the timing data and the constant angular velocity;
create a reference table in system memory the reference table comprising the accurate positions; and
during operation of the motor, calculate accurate angular velocity values for the motor, using the reference table.

10. The system of claim 9, wherein the at least one processor is further configured to:
identify a plurality of time-stamps, each of the plurality of time-stamps associated with a respective one of the polarity changes, during rotation of the magnetic field; and
calculate a plurality of time difference values associated with the plurality of time-stamps, wherein the timing data comprises at least the plurality of time difference values.

11. The system of claim 10, wherein the at least one processor is further configured to:
calculate average time difference values using the plurality of time difference values;
wherein computing the accurate positions for each of the plurality of digital Hall effect sensors is performed using the average time difference values and the constant angular velocity.

12. The system of claim 10, wherein the at least one processor is further configured to:
reverse the rotating magnetic field to rotate in a second direction, wherein the second direction opposes the first direction;
identify a second plurality of time-stamps, each of the second plurality of time-stamps associated with a respective one of the polarity changes, during rotation of the magnetic field in the second direction; and
calculate a second plurality of time difference values associated with the second plurality of time-stamps, wherein the timing data comprises at least the plurality of time difference values and the second plurality of time difference values.

13. The system of claim 12, wherein the at least one processor is further configured to:
calculate the average time difference values using the plurality of time difference values and the second plurality of time difference values;
wherein computing the accurate positions for each of the plurality of digital Hall effect sensors is performed using the average time difference values and the constant angular velocity.

14. The system of claim 9, wherein the at least one processor is further configured to:
initiate a calibration mode of the motor, by the processor, prior to generating the rotating magnetic field; and
after creating the reference table, exit the calibration mode of the motor;
wherein the operation of the motor occurs after calibration is performed during the calibration mode.

15. The system of claim 9, wherein the accurate positions comprise calculated distances between the digital Hall effect sensors; and
wherein the accurate angular velocity values are calculated using the calculated distances stored in the reference table.

16. A non-transitory, computer-readable medium containing instructions thereon, which, when executed by a processor, perform a method comprising:
- initiating a calibration mode of a motor, the motor comprising a permanent magnet synchronous motor;
- generating a rotating magnetic field using a voltage vector, the rotating magnetic field configured to rotate at a constant angular velocity independent of an actual rotor position, and the rotating magnetic field rotating in a first direction;
- detecting polarity changes of rotor magnets relative to the plurality of digital Hall effect sensors during rotation of the motor;
- identifying, by a processor, timing data associated with the polarity changes of the plurality of digital Hall effect sensors;
- computing, by the processor, accurate positions for each of the plurality of digital Hall effect sensors, using the timing data and the constant angular velocity wherein the accurate positions comprise calculated distances between the digital Hall effect sensors;
- creating a reference table in system memory, by the processor, the reference table comprising the accurate positions;
- exiting the calibration mode of the motor; and
- during operation of the motor, calculating accurate angular velocity values for the motor, using the reference table, wherein the accurate angular velocity values are calculated using the calculated distances stored in the reference table.

17. The non-transitory, computer-readable medium of claim 16, wherein the method further comprises:
- identifying a plurality of time-stamps, each of the plurality of time-stamps associated with a respective one of the polarity changes, during rotation of the magnetic field; and
- calculating a plurality of time difference values associated with the plurality of time-stamps, wherein the timing data comprises at least the plurality of time difference values.

18. The non-transitory, computer-readable medium of claim 17, wherein the method further comprises:
- calculating average time difference values using the plurality of time difference values;
- wherein computing the accurate positions for each of the plurality of digital Hall effect sensors is performed using the average time difference values and the constant angular velocity.

19. The non-transitory, computer-readable medium of claim 17, wherein the method further comprises:
- reversing the rotating magnetic field to rotate in a second direction, wherein the second direction opposes the first direction;
- identifying a second plurality of time-stamps, each of the second plurality of time-stamps associated with a respective one of the polarity changes, during rotation of the magnetic field in the second direction; and
- calculating a second plurality of time difference values associated with the second plurality of time-stamps, wherein the timing data comprises at least the plurality of time difference values and the second plurality of time difference values.

20. The non-transitory, computer-readable medium of claim 19, wherein the method further comprises:
- calculating the average time difference values using the plurality of time difference values and the second plurality of time difference values;
- wherein computing the accurate positions for each of the plurality of digital Hall effect sensors is performed using the average time difference values and the constant angular velocity.

* * * * *